United States Patent [19]

Otaka

[11] Patent Number: 5,149,967
[45] Date of Patent: Sep. 22, 1992

[54] CHARGED-PARTICLE BEAM APPARATUS

[75] Inventor: Tadashi Otaka, Katsuta, Japan

[73] Assignee: Hitachi, Ltd., Tokyo, Japan

[21] Appl. No.: 594,947

[22] Filed: Oct. 10, 1990

[30] Foreign Application Priority Data

Oct. 13, 1989 [JP] Japan .................. 1-265088

[51] Int. Cl.⁵ ............................. H01J 37/20
[52] U.S. Cl. ................. 250/310; 250/442.11;
250/396 ML
[58] Field of Search ............ 250/310, 442.1, 311,
250/306, 396 ML

[56] References Cited

U.S. PATENT DOCUMENTS

| 3,629,577 | 12/1971 | Weber et al. | 250/442.1 |
| 3,778,621 | 12/1973 | Mikajiri | 250/442 |
| 3,952,215 | 4/1976 | Sakitani | 250/442.1 |
| 4,798,989 | 1/1989 | Miyazaki et al. | 310/328 |
| 4,818,874 | 4/1989 | Ishikawa | 250/310 |
| 4,866,280 | 9/1989 | Ohtaka | 250/442.1 |

FOREIGN PATENT DOCUMENTS 58-161235  9/1983  Japan .
61-64055   4/1986  Japan .
62-291849 12/1987  Japan .
711872     7/1954  United Kingdom .

OTHER PUBLICATIONS

Van Nostrand's Scientific Encyclopedia, Fifth Edition, 1976, pp. 2349-2350.

Primary Examiner—Jack I. Berman
Attorney, Agent, or Firm—Antonelli, Terry, Stout & Kraus

[57] ABSTRACT

The charged-particle beam apparatus according to this invention is of the type in which a specimen is inserted between the upper and lower magnetic poles of an objective lens, and is constructed such that stages, which are used to move a specimen in a desired direction, are mounted one on top another from the bottom wall of the objective lens, thus preventing the specimen from being affected by external vibration. Devices, which do not generate a magnetic field, are used to drive the stages. This enables the drive devices to be directly connected to the stages, so that the stages are moved accurately.

60 Claims, 6 Drawing Sheets

CHARGED-PARTICLE BEAM APPARATUS

BACKGROUND OF THE INVENTION

This invention relates to a charged-particle beam apparatus, and more particularly to a charged-particle beam apparatus for observing a specimen introduced in a gap between upper and lower magnetic poles of an objective lens, wherein there is provided a specimen stage which permits observation of a large-diameter wafer which is inclined.

In an electron microscope, for example, if a large working distance from the center of the objective lens to the specimen is set, then the aberration of the objective lens becomes large, so that a high resolving power cannot be obtained unless a high accelerating voltage of the objective lens is used.

Therefore, as disclosed in JP-A-58-161235, in recent years, a method has been practiced in which a specimen is introduced between the upper and lower magnetic poles of the objective lens with the result that the specimen can be observed with less aberration of the objective lens.

With an electron microscope having such a construction, the interpole gap between the upper and lower poles is so narrow that a conventional large specimen stage cannot be used in its present size, and therefore, it is necessary to make some contrivance for the specimen stage.

In JP-A-61-64055, for example, there have been proposed a method in which the specimen stage is made in a cantilever type support structure and a specimen is observed while it is moved from outside, and another method in which the ends of the upper and lower poles are pointed and the specimen is inclined at an elevated angle.

In JP-A-62-291849, there has been proposed a method in which the specimen stage is constructed with the bottom wall of the lower magnetic pole as a base.

With the specimen stage having a cantilever type support structure as revealed in the above-mentioned JP-A-61-64055, it is difficult to move the specimen slightly in the X-Y or horizontal direction, and since the end portion of the specimen stage is supported in the form of a cantilever in the magnetic path of the objective lens, the specimen observing section is susceptible to effects of external vibration, and it is difficult to observe the specimen with a high resolving power.

As for a method of inclining the specimen, the only proposal has been to shape the upper and lower magnetic poles to allow inclining to an elevated angle, but no concrete specimen inclining method has been proposed.

On the other hand, in JP-A-62-291849 mentioned above, though it has been proposed to construct a specimen stage which moves in the X and Y directions, by basing it on the inside bottom face of the lower magnetic pole, no concrete form of construction for cutting off the effects of external vibration has been suggested. In addition, no construction for inclining the specimen has been disclosed.

SUMMARY OF THE INVENTION

A first object of this invention is to propose a charged-particle beam apparatus which has installed in the interpole gap of an objective lens a specimen's position adjusting means which is less susceptible to the affect of external vibration or has no effects on the magnetic field in the objective lens and which can move a large-diameter specimen accurately in the horizontal direction, and/or incline the specimen.

A second object of this invention is to provide a specimen's position adjusting device having a small size, which is capable of accurate and fine movement in a direction substantially perpendicular to the axis of the beam and is not susceptible to effects of external vibration.

A third object of this invention is to provide a specimen's position adjusting device having no affect on the magnetic field in the objective lens and which is not susceptible to external vibration, installed in the interpole gap of the objective lens and capable of inclining the specimen relative to the axis of the beam.

In order to achieve the first object, a charged-particle beam apparatus according to this invention is constructed such that stages for moving a specimen in one direction or inclining the specimen are mounted one on top of another from the bottom wall of the objective lens. A stage for moving a specimen perpendicularly to the axis of the beam can be directly connected to a driving power source by using a driving power source which does not generate a magnetic field. By this arrangement, the movement of this stage is controlled accurately. If an inchworm motor is used, the movement of this stage can be controlled accurately and finely.

The second object can be achieved by use of a stage for movement in a direction perpendicular to the axis of the beam and also by use of moving means for this stage, such as used to achieve the first object mentioned above.

The third object can be achieved by stacking support means and a pair, or two pairs if necessary, of inclining stages on the bottom wall of the objective lens, and providing a space which vertically penetrates the support means and the inclining stage and serves to prevent interference of the objective lens with the lower magnetic pole.

DESCRIPTION OF THE PREFERRED EMBODIMENTS

This invention will be described in detail with reference to the accompanying drawings.

Figure 1:
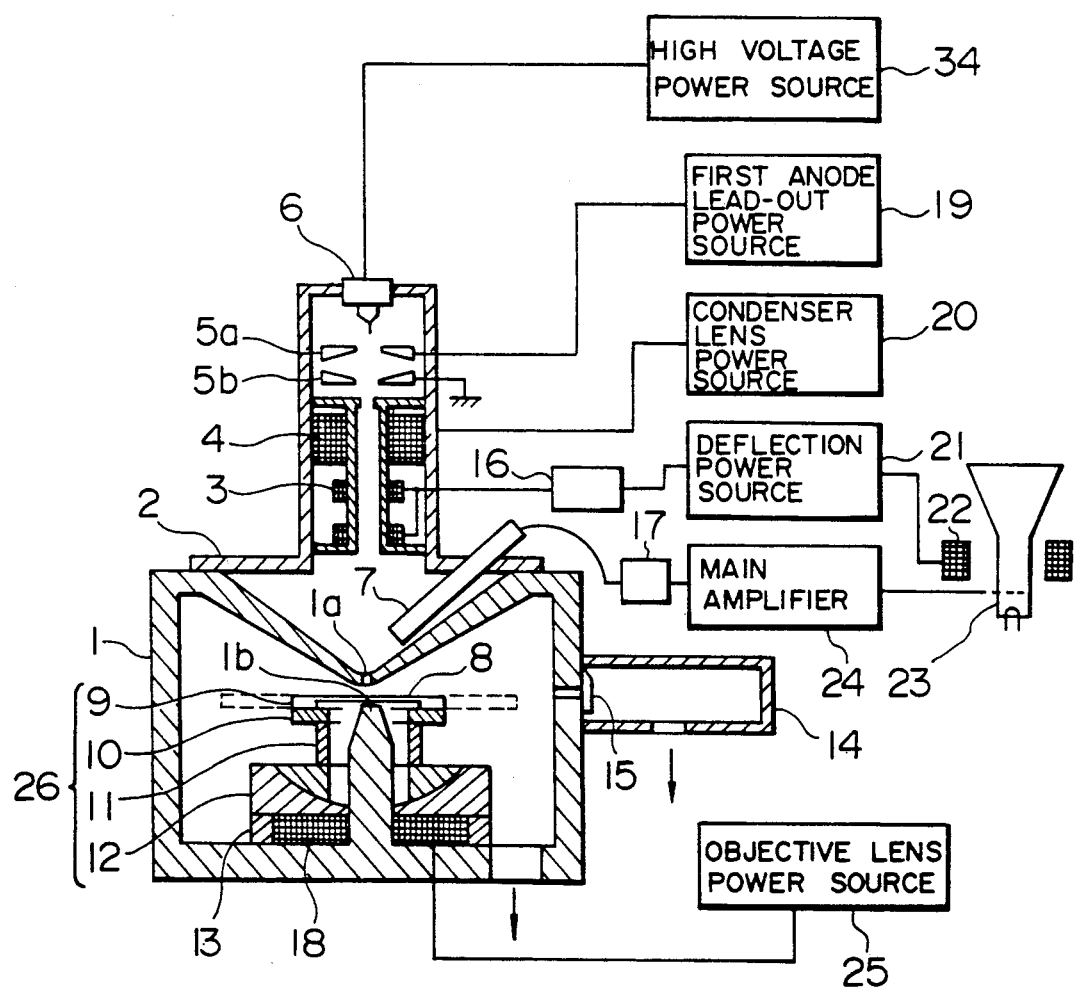
FIG. 1 is a sectional view of an electron microscope according to an embodiment of this invention.

In FIG. 1, a field emission tip 6 is connected to a high-voltage power source 34, and the field emission tip 6 emits electrons according of a potential difference with respect to a first anode 5a.

After being accelerated by a second anode 5b, the electrons are converted by a condenser lens 4 to a narrow beam, deflected by a deflection coil 3, and strike a specimen 8 placed between an upper magnetic pole 1a and a lower magnetic pole 1b of an objective lens 1.

According to this embodiment, the interpole gap of the objective lens 1 is about 10 mm, by which a focal length of several mm can be obtained, and a high-performance lens with a chromatic aberration coefficient and a spherical aberration coefficient each of three to four mm can be provided.

The first anode 5a is connected to a first anode lead-out power source 19, the condenser lens 4 is connected to a condenser lens power source 20, a deflecting coil 3 is connected through a magnification control device 16 to a deflection power source 21, and a coil 18 of the objective lens 1 is connected to an objective lens power source 25.

Secondary electrons emitted from the specimen 8 by irradiation of the electron beam are detected by a secondary electron detector 7 installed above the upper magnetic pole 1a, and a detection signal, after being amplified by a preamplifier 17 and a main amplifier 24, is input as a brightness modulation signal to a cathode ray tube 23.

A cathode ray deflecting coil 22 of the cathode ray tube 23 is connected to a deflection power source 21, and the cathode ray beam of the cathode ray tube 23 is deflected according to the deflection of the electron beam in the electron microscope by the above-mentioned deflecting coil 3.

A specimen 8 is placed on a specimen stage 26 which is chiefly composed of an X-direction movement table 9. A Y-direction movement table 10, a Y-direction inclining stage 11, and an X-direction inclining stage 12.

The specimen is introduced and changed by utilizing a specimen exchange chamber 14 provided at a side face of the magnetic path of the objective lens 1. A gate valve 15 is provided between the objective lens and the specimen exchange chamber 14. The interior of the objective lens 1 and the interior of the specimen exchange chamber 14 are evacuated by a vacuum pump, not shown.

Figure 2:
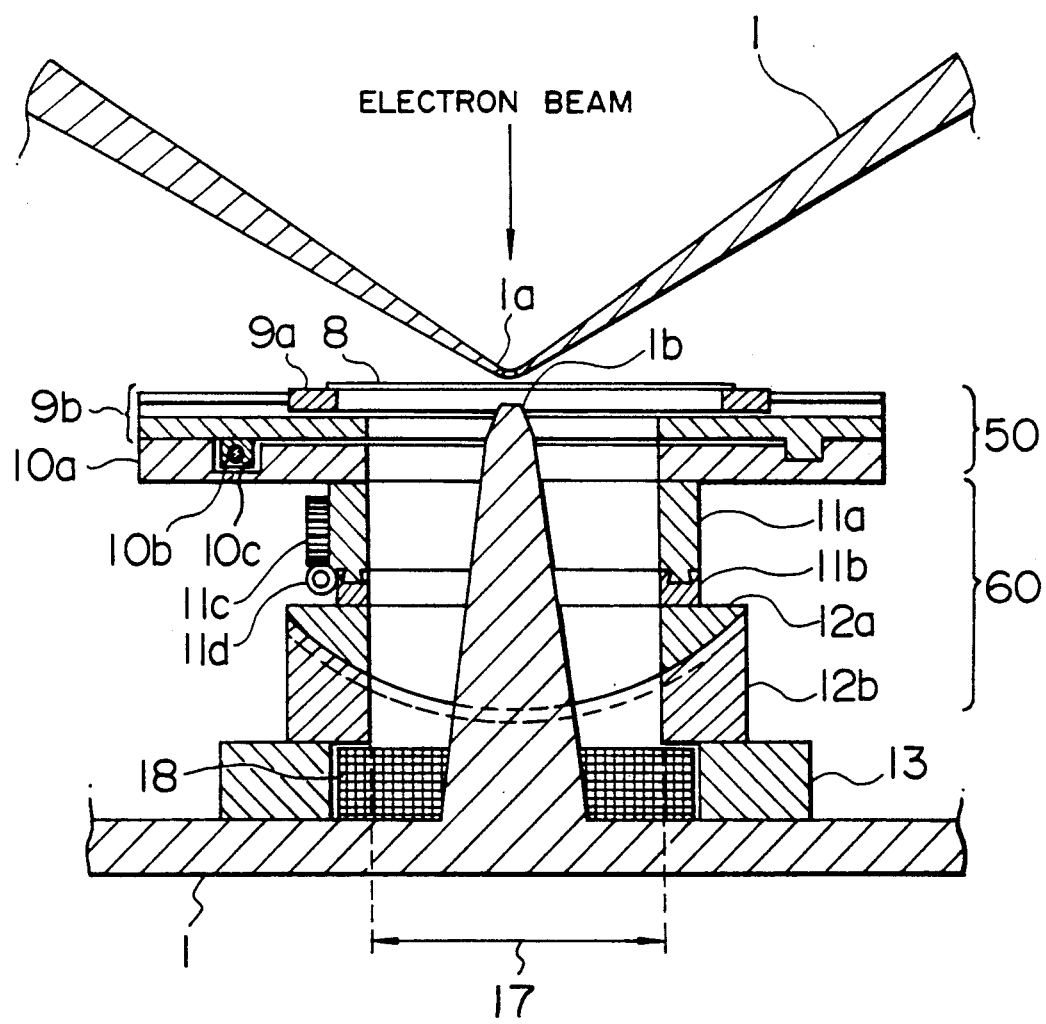
FIG. 2 is an enlarged sectional view of the specimen stage and its vicinity shown in FIG. 1.
Figure 3A:
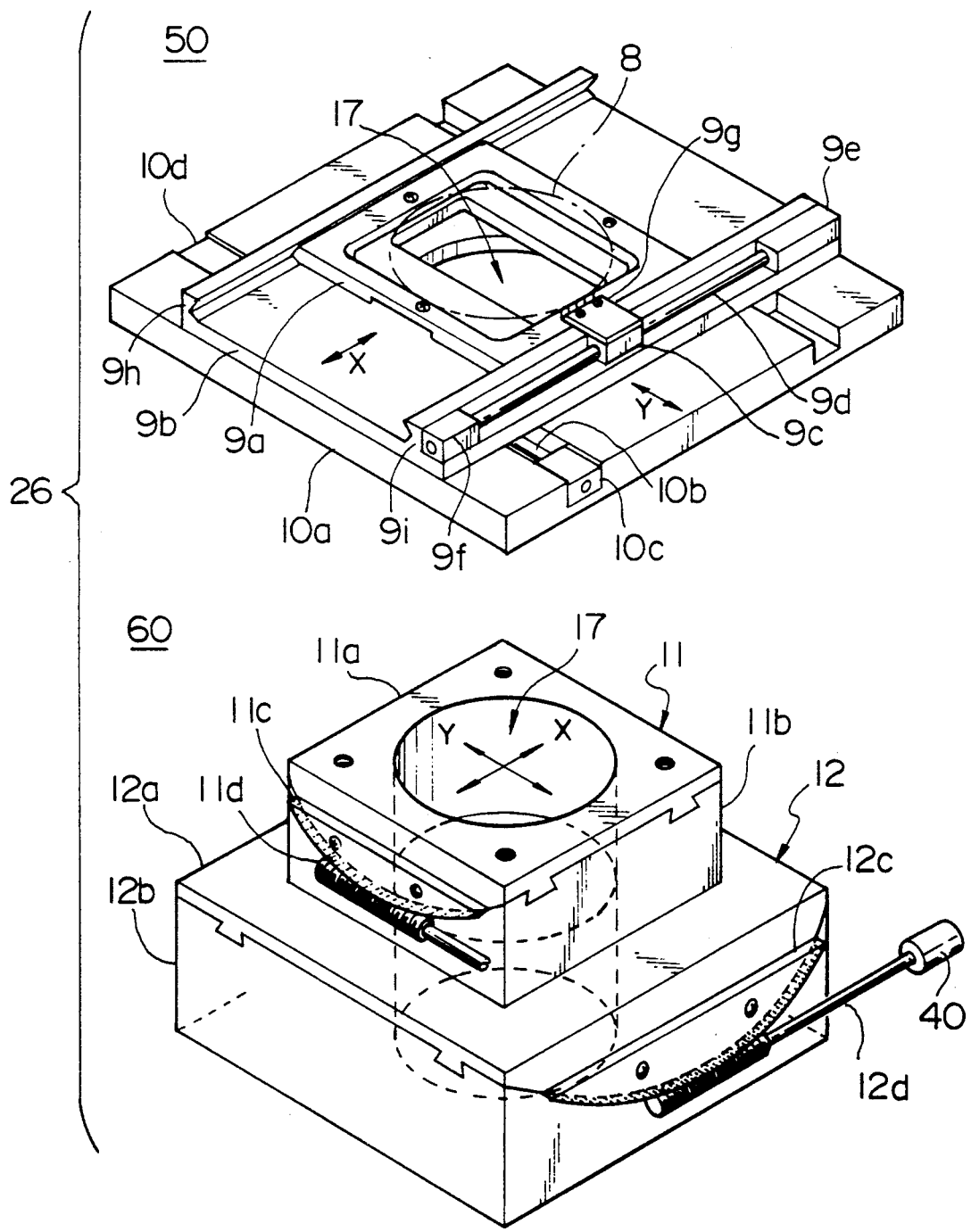
FIGS. 3A and 3B are partially transparent perspective views of the specimen stage.

Referring to FIGS. 2 and 3A, the construction of the above-mentioned specimen stage 26 will be described in detail.

As shown in FIG. 3A, the specimen stage 26 according to this embodiment comprises an X-Y stage 50 and an inclining stage 60. In FIG. 3A, the X-Y stage 50 and the inclining stage 60 are separated. In practical use, a Y-direction movement support table 10a of the X-Y stage 50 and an inclining table 11a of the inclining stage 50 are fixed, which will be described later.

Detailed description is made first of the composition of the X-Y stage 50.

The X-Y stage 50 chiefly comprises a wafer table 9a, an X-direction movement support table 9b for supporting the movement of the wafer table 9a in the X-direction, and a Y-direction movement support table 10a for supporting the movement of the X-direction movement support table 9b in the Y-direction.

The wafer table 9a mentioned above is supported with both sides thereof fitted in the V-grooves of guides 9h, 9i provided at both end portions of the X-direction movement support table 9b, so that the wafer table can slide in the X-direction along the V-grooves. These guides 9h, 9i cannot be formed of a material with magnetic properties, but are made of ceramics, for example.

A guide rod 9d and a linear actuator 9c constitute a linear driving device, the guide rod 9d being installed along the guide 9i with both end portions thereof fixed with fixing blocks 9f, 9e, the linear actuator having the guide rod 9d passed therethrough.

The linear actuator 9c is connected to the above-mentioned wafer table 9a by way of a connection fitting 9g. Driven by the linear actuator 9c, the wafer table 9a moves in the X direction on the X-direction movement support table 9b. Thus, the movement of the wafer table 9a is controlled accurately. In other words, if an ordinary motor incorporating a coil is used, in order to preclude the effects of a magnetic field that the coil generates, the motor needs to be installed outside the objective lens 1. If this is done, owing to mechanical errors of a device connecting the wafer table and the motor, e.g. a coupling, it is impossible to accurately control the movement of the wafer table.

On the other hand, the Y-direction movement support table 10a has two grooves formed in the Y direction on the surface thereof. At one of the grooves, a guide rod 10b is fixed with fixing blocks 10c, 10d in the same manner as with the other guide rod 9d for the X direction movement.

The guide rod 10b has installed thereon a linear actuator (not shown) fixed to the X-direction movement support table 9b in the same manner as with the other guide rod 9d. Driven by the linear actuator, the X-direction movement support table 9b is moved in the Y direction on the Y-direction movement support table 10a.

In this embodiment, in order to allow the specimen to move in any direction while keeping a narrow interpole gap of the objective lens 1, a relief space 17 into which the lower magnetic pole can enter is provided 10 in the center areas of the wafer table 9a, the X-direction movement support table 9b, and the Y-direction movement support table 10a. By this means, those moving parts are prevented from contacting the lower magnetic pole 1b of the objective lens 1.

The construction of the above-mentioned linear actuator 9c will now be described briefly.

In this embodiment, an inchworm-shaped jogging linear actuator utilizing a piezoelectric phenomenon by a piezoelectric element is used for the above-mentioned linear actuator. An example of a linear actuator constructed as described is the inchworm motors of Burleigh Instrument, Inc.

Figure 4:
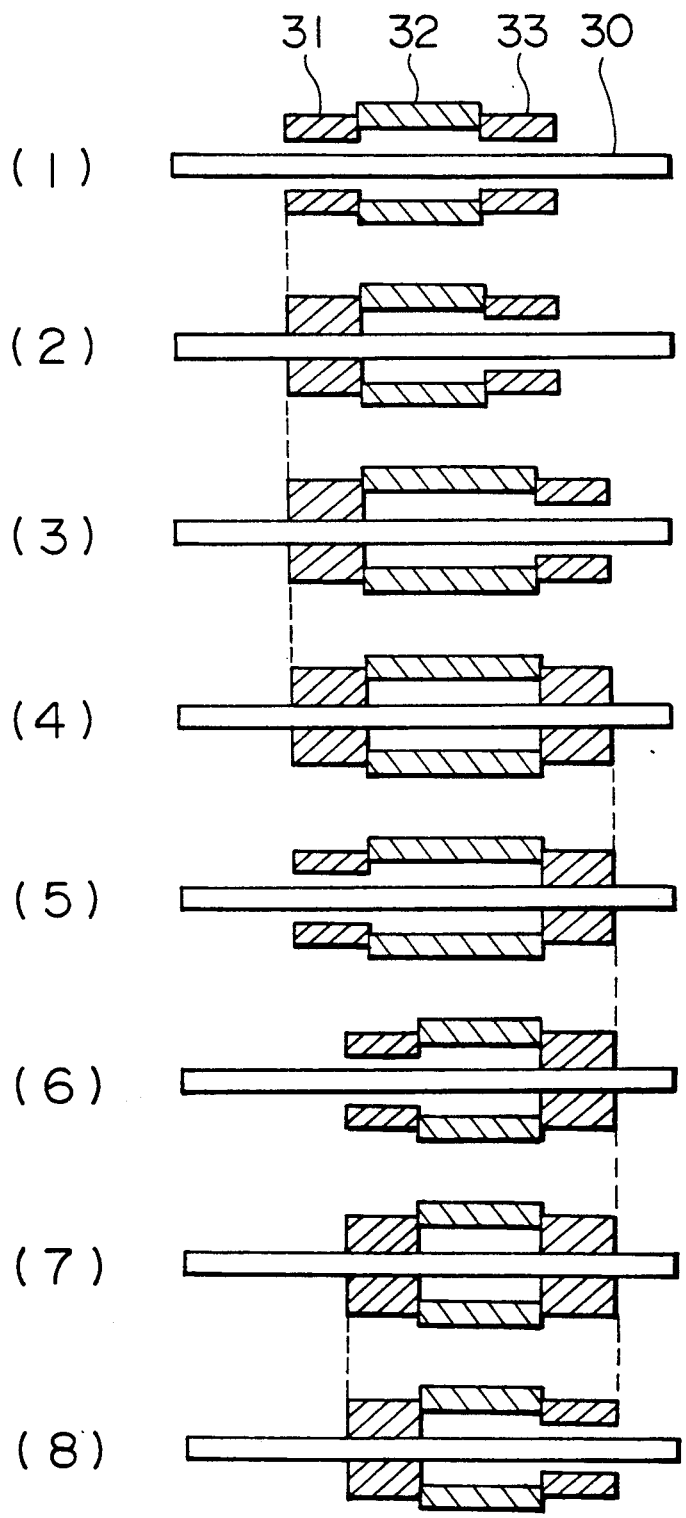
FIG. 4 is a diagram for explaining the operation of the actuator.

FIG. 4 is a diagram for explaining the inchworm actuator.

As shown in FIG. 4, the inchworm actuator comprises three piezoelectric elements (hereafter referred to as PZT) 31, 32, 33. When a voltage is applied to PZTs 31, 33, they function to grasp the guide rod 30, while PZT32 at the center, when it has a voltage applied thereto, functions to expand axially along the guide rod 30.

The operation progresses as:

(1) No voltage is applied to each PZT. PZTs 31, 33 are not holding the guide rod 30, and PZT32 keeps its normal length.

(2) Voltage is applied only to PZT31 to let it hold the guide rod 30.

(3) While voltage is applied to PZT31 voltage is also applied to PZT32, which thereby expands along the guide rod 30.

(4) While voltage is applied to PZTs 31, 32, voltage is also applied to PZT33 to let it grasp the guide rod 30.

(5) Only the voltage supply to PZT31 is stopped to let it release the guide rod 30.

(6) Next, the voltage supply to PZT32 is also stopped, and PZT32 returns to its normal length.

(7) Voltage is applied again to PZT31 to let it grasp the guide rod 30.

(8) The voltage supply to PZT33 is stopped to let it release the guide rod 30.

By repeating this operation, the inchworm makes a stepping motion continuously.

As is well known, since the piezoelectric phenomenon by a piezoelectric element does not generate a magnetic field, if an inchworm actuator utilizing a piezoelectric phenomenon is used, a specimen (a field of view) can be moved without having any effects on the image being observed, and a moving means for a specimen can be provided which is smaller in size and more accurately and finely movable than the cantilever type support structure of the prior art.

Figure 3B:
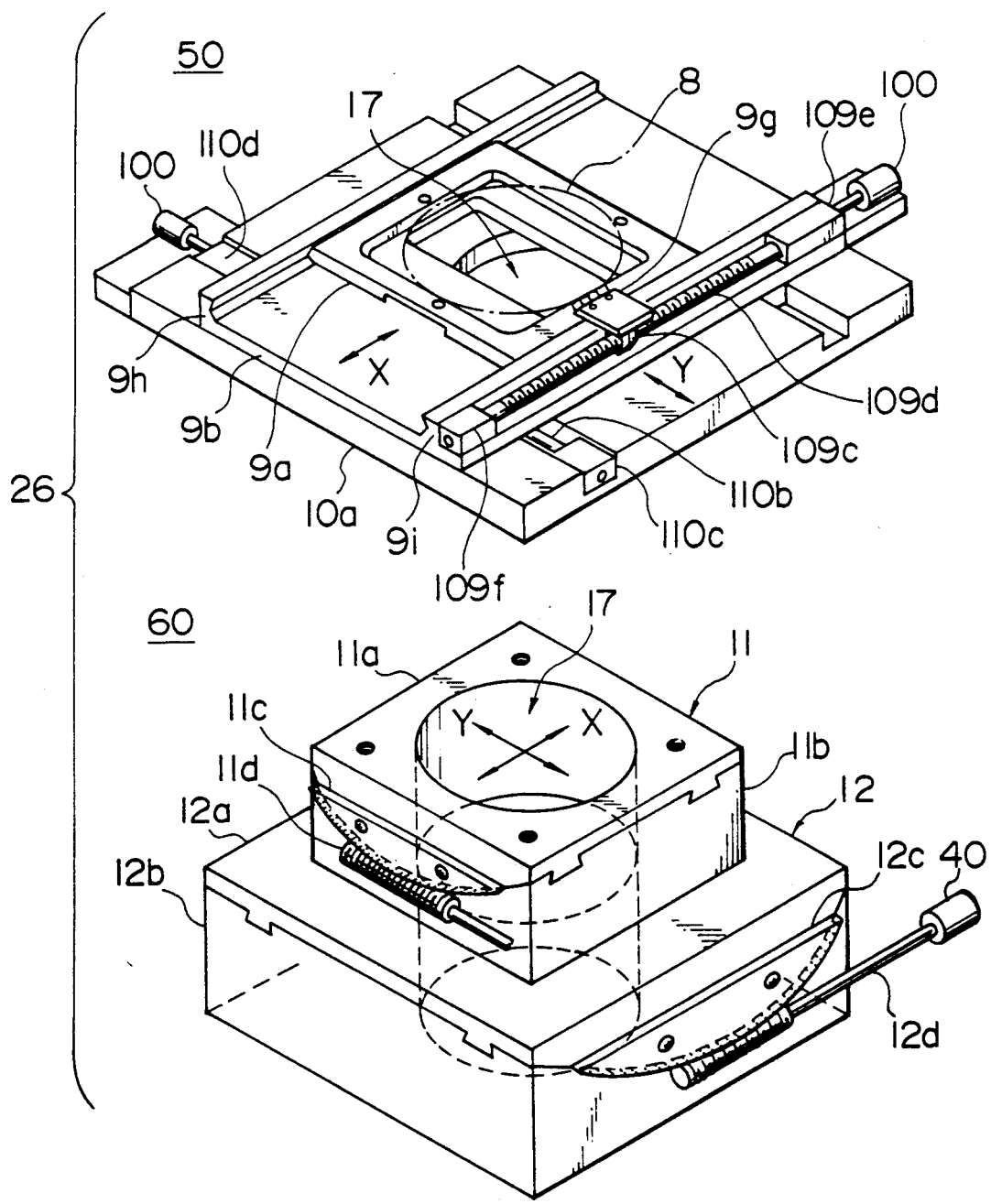

FIG. 3B shows an example in which an ultrasonic motor 100, which does not generate a magnetic field, is used as a drive source to move the X-Y stage. In FIG. 3B, those parts which are identical with those of FIG. 3A are designated by the same reference numerals. In FIG. 3B, reference numeral 109d indicates a screw rod connected to a rotating shaft of an ultrasonic motor 100, and is supported by radial bearings 109e, 109f. The screw rod 109d has a nut 109c screwed thereon. Under this arrangement, the nut 109c moves in the X direction as the screw rod 109d rotates, so that the X-direction stage 9a is moved in the same direction.

In FIG. 3B, a screw rod 110b for supporting the movement of the X-direction stage 9b in the Y direction is supported by radial bearings 110c, 110d.

Description will now be made of the construction of the inclining stage 60.

In FIG. 3A, the inclining stage 60 comprises a Y-direction inclining stage 11 and an x-direction inclining stage 12. The inclining directions are not limited to the X and Y directions, but may be directions 45°, for example, shifted from the X and Y directions shown in FIG. 3A.

The Y-direction inclining stage 11 comprises an inclining table 11a, an inclining support block 11b, a circular gear (worm wheel) 11c, and a worm gear 11d. By rotating the worm gear 11d, the inclining table 11a can be inclined.

The inclining motion of the inclining table 11a by the circular gear 11c is done with the intersection of the center of the objective lens and the surface of the specimen as the center of the inclining motion. In other words, the inclining table 11a is inclined with the observed spot of the specimen as the center, which is the intersection of the specimen and the beam of electrons.

On the other hand, the x-direction inclining stage 12 comprises an inclining table 12a, an inclining support block 12b, a circular gear 12c, and a worm gear 12d. By rotating the worm gear 12d by a motor 40 arranged outside the objective lens 1, the inclining table 12a can be inclined. An ultrasonic motor may be used for the motor 40.

The inclining motion of the inclining table 12a by the circular gear 12c is done with the intersection of the center of the objective lens and the surface of the specimen as the center of the inclining motion in the same manner as in the inclination of the inclining table 11a.

As shown in FIG. 2, the inclining stage 60 constructed as described is installed on the bottom wall of the lower magnetic pole, and a relief space 17 is provided substantially in the center areas of the inclining tables 11a, 12a and the inclining support blocks 11b, 12b so that the lower magnetic pole 1b does not contact those inclining tables and inclining support blocks.

The X-Y stage 50 and the inclining stage 60 are placed in a strong magnetic field. Therefore, the parts of those stages need to be made of non-magnetic material.

According to this embodiment, the inclining stage 60 and the X-Y stage 50 are installed on the bottom wall of the lower magnetic pole and around the lower magnetic pole 1b. This prevents the specimen from being affected by external vibration and makes observation with high resolution possible.

The center point of the inclining motion by the inclining means is the observed point of the specimen, and therefore, it never occurs that a field of view comes out of the observation range when the specimen is inclined. In addition, if the specimen is moved by operating the X-Y stage with the specimen inclined, the specimen is kept at a constant height at the observed position of the specimen, so that the observed spot of the specimen can be moved with the specimen inclined.

In the foregoing embodiment, description has been made based on the arrangements that the specimen stage comprises an X-Y stage 50, which uses piezoelectric elements, and an inclining stage 60, and that the specimen stage is capable of both moving in the X and Y directions and inclining in the X and Y directions. However, this invention is not limited to these functions, but can be applied to applications wherein only an X-Y stage using piezoelectric elements is used or the X-Y stage is used in combination with an inclining table capable of inclining either in the X or Y direction only, which applications do not constitute departures from the spirit and scope of the present invention.

In the foregoing embodiment, this invention has been described by taking as an example an electron microscope for which a specimen is introduced in the gap between the upper and lower poles of the objective lens, but this invention may be applied to an electron microscope in which a specimen is introduced below the objective lens. In this case, a relief space for the lower magnetic pole need not be provided in the center area of the X-Y stage or the inclining table.

In the foregoing embodiment, description has been made of an arrangement such that the inclining stage is made of a combination of an X-direction inclining stage and a Y-direction inclining stage in order to incline the X-Y stage 50 in any desired direction. However, in place of the X-direction inclining stage, as shown in FIG. 5, it is possible to use a Y-direction inclining stage which surrounds the lower pole and is based on the inside bottom face of the lower pole, and have the Y-direction inclining stage held by a rotary support block, which is provided in such a way as to be rotatable about the optical axis of the electron beam block.

Figure 5:
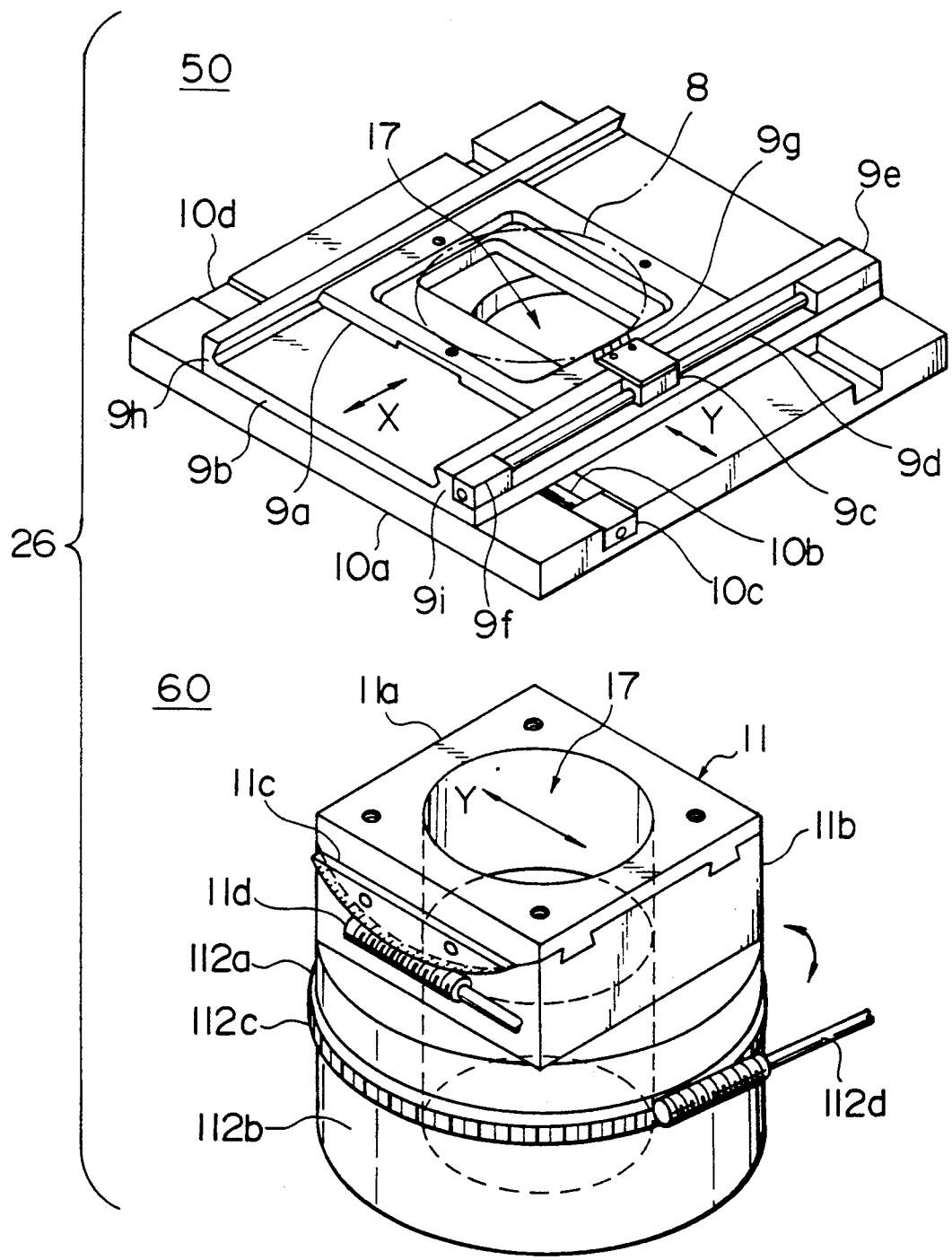
FIG. 5 is a partially transparent perspective view of the specimen stage according to another embodiment of this invention.

In FIG. 5, those parts identical with those of FIG. 3 are designated by the same reference numerals. In FIG. 5, reference numeral 112b denotes a cylindrical block fixed to the inside bottom face of the objective lens, and a rotary block 112a is mounted on the block 112b in such a manner that the rotary block 112a can rotate in the circumferential direction. This rotary block 112a has a worm wheel 112c with which a worm gear 112d engages.

As is clear from the foregoing description, the present invention offers the following advantages:

(1) Piezoelectric elements are used for the linear actuators, and by utilizing a piezoelectric phenomenon, the specimen stage is moved. This makes it possible to form a small specimen stage free from effects of magnetism and move the stage accurately and finely.

(2) A relief space is provided for the lower magnetic pole in the specimen stage, and the inclining stage is so formed as to surround the lower magnetic pole and is based on the lower pole. The specimen stage is made less susceptible to adverse effects of external vibration and permits observation of the specimen with high resolution.

(3) The center of the inclining motion by the inclining means is the observed spot of the specimen. Therefore, the field of view never comes out of the range of observation when the specimen is inclined.

(4) Even if the specimen is moved by operating the X-Y stage with the specimen inclined, the specimen is kept at a constant height at the observed position of the specimen, so that the observed spot can be moved with the specimen inclined.

I claim:

1. A specimen stage mounted inside an objective lens having a magnetic pole projecting from a bottom wall of the lens, for use in a charged particle beam apparatus, said specimen stage comprising:
   inclination means supported by said bottom wall of the lens and having a space in which the magnetic pole is inserted for adjusting and angle of inclination of a specimen; and
   a specimen holder supported on said inclination means.

2. A specimen stage according to claim 1, wherein said inclination means comprises a first supporting block supported by said bottom wall and a first inclining table supported by said first supporting block, said specimen holder being supported by said first inclining table.

3. A specimen stage according to claim 2, wherein said first inclining table inclines substantially around a portion of the specimen on which the beam impinges as a center of the inclination thereof.

4. A specimen stage according to claim 3, wherein said first supporting block supports said first inclining table with a surface of arc, and the center of the arc being substantially in agreement with the center of inclination of said first inclining table.

5. A specimen stage according to claim 2, further comprising:
   moving means for tilting said first inclining table and maintaining the table at a predetermined slant, said moving means also being disposed inside the objective lens.

6. A specimen stage according to claim 4, further comprising:
   a worm wheel mounted on said first inclining table and having a shape corresponding to said surface of arc, a worm gear engaging with said worm wheel and a motor for rotating said worm gear, wherein said motor is also disposed inside the objective lens.

7. A specimen stage according to claim 2, wherein said inclination means further comprises:
   a second supporting block supported by said first inclining table, and a second inclining table supported by said second supporting block,
   wherein said second inclining table inclines in a different direction from the first inclining table, said specimen holder being supported by said second inclining table.

8. A specimen stage according to claim 7, wherein said second inclining table inclines substantially around a portion of the specimen on which the beam impinges as a center of the inclination thereof.

9. A specimen stage according to claim 8, wherein said second supporting block supports said second inclining table with a surface of arc, and the center of the arc is substantially in agreement with the center of inclination of said second inclining table.

10. A specimen stage according to claim 7, further comprising:
    moving means for tilting said second inclining table and maintaining the second inclining table at a predetermined slant, said moving means also being disposed inside the objective lens.

11. A specimen stage according to claim 9, further comprising:
    a worm wheel mounted on said second inclining table and having a shape corresponding to said surface of arc, a worm gear engaging with said worm wheel and a motor for rotating the worm gear, wherein said motor is also disposed inside the objective lens.

12. A charged particle beam apparatus, comprising:
    means for generating a charged particle beam on a beam path;
    an objective lens for focusing the beam, wherein the lens has a magnetic pole projecting from a bottom wall of the lens;
    a stage for supporting a specimen thereon with a variable inclination to the beam path, wherein the stage is disposed inside the lens, is supported by the bottom wall of the lens and has a space in which the magnetic pole is inserted; and
    means for detecting indications characteristic of the specimen, generated from the surface of the specimen, by irradiating the beam on the specimen.

13. An apparatus according to claim 12, wherein said stage includes:
    a first supporting block supported by the bottom wall of the lens;
    a first inclining stage supported by said first supporting block wherein said first supporting block supports said first inclining table with a first surface of arc, and the center of the first surface of arc is substantially in agreement with the center of inclination of said first inclining table;
    first moving means for tilting said first inclining table and maintaining the first inclining table at a predetermined slant, said first moving means also being disposed inside the objective lens;
    a second supporting block being supported by said first inclining table;
    a second inclining table supported by said second supporting block, wherein said second supported block supports said second inclining table with a second surface or arc, and the center of the second surface of arc is substantially in agreement with the center of inclination of said second inclining table, said second inclining table inclining in a different direction from the first inclining table;
    second moving means for tilting said second inclining table and maintaining the second inclining table at a predetermined slant, said second moving means also being disposed inside the objective lens; and
    holding means for holding the specimen, the holding means being supported by said second inclining table.

14. An objective lens for a charged particle beam apparatus in which a stage of a specimen is disposed, comprising:

a magnetic pole projecting from a bottom wall of the lens; and inclination means for holding a specimen and inclining the specimen, wherein the inclination means is supported by the bottom wall of the lens and has a space in which the magnetic pole is inserted.

15. A lens according to claim 14, wherein said inclination means includes:

a first supporting block supported by the bottom wall of the lens;

a first inclining stage supported by said first supporting block, wherein said first supporting block supports said first inclining table with a first surface of arc, and the center of the first surface of arc is substantially in agreement with the center of inclination of the first inclining table;

first moving means for tilting the first inclining table and maintaining the first inclining table at a predetermined slant, said first moving means also being disposed inside the objective lens;

a second supporting block supported by said first inclining table;

a second inclining table supported by said second supporting block, wherein said second supporting block supports said second inclining table with a second surface or arc, and the center of the second surface of arc is substantially in agreement with the center of inclination of said second inclining table and the second inclining table inclines in a different direction from the first inclining table;

second moving means for tilting said second inclining table and maintaining the second inclining table at a predetermined slant, said second moving means also being disposed inside the objective lens; and holding means for holding the specimen, said holding means being supported by said second inclining table.

16. A specimen stage mounted inside an objective lens having a first magnetic pole on a bottom wall of the lens and a second magnetic pole on an upper wall of the lens, for use in a charged particle beam apparatus, and said specimen stage comprising:

inclination means for supporting and inclining a specimen, wherein relief space is formed between the inclination means and the second magnetic pole to enable the inclination means to move without interference with the second magnetic pole when the inclination means inclines.

17. A specimen stage according to claim 16, wherein the second magnetic pole has a conical shape and a center axis disposed in agreement with the trajectory of the charged particle beam, and the relief space is formed between a slope of the second magnetic pole and an upper surface of the inclination means.

18. A specimen stage according to claim 16, wherein the first magnetic pole projects from the bottom wall of the lens, said inclination means being supported by the bottom wall and having a space into which the first magnetic pole is inserted.

19. A specimen stage according to claim 18, wherein said inclination means comprises a first supporting block supported by the bottom wall of the lens, a first inclining table supported by said first supporting block and holding means for holding the specimen supported by the first inclining table.

20. A specimen stage according to claim 19, wherein said inclination means further comprises:

a second supporting block supported by said first inclining table, and a second inclining table supported by said second supporting block, wherein the second inclining table inclines in a different direction from the first inclining table, and said holding means for holding the specimen being supported by the second inclining table.

21. A specimen stage according to claim 20, further comprising:

exciting means for generating a magnetic field in the lens, said exciting means being disposed on the opposite side of said holding means from said second magnetic pole.

22. A specimen stage according to claim 21, wherein said exciting means is a coil which is disposed inside said first supporting means.

23. A specimen stage according to claim 22, wherein said coil for exciting the lens is disposed around the first magnetic pole, the inner surface of the coil being substantially in contact with the first magnetic pole.

24. A charged particle beam apparatus, comprising:
means for generating a charged particle beam;
an objective lens for focusing the beam, wherein the lens has a first magnetic pole on its bottom wall and a second magnetic pole on its upper wall;
a stage for holding and inclining a specimen thereon inside the lens, wherein a relief space is formed between the stage and the second magnetic pole to enable the stage to move without interference with the second magnetic pole when the stage inclines; and means for detecting indications characteristic of the specimen, generated from the surface of the specimen by irradiating the beam on the specimen.

25. An apparatus according to claim 24, wherein said first magnetic pole projects from the bottom wall of the lens;

said second magnetic pole has a conical shape and a center axis which is in agreement with the trajectory of the charged particle beam;

the stage having:

a first supporting block supported by the bottom wall of the lens, a first inclining stage supported by the first supporting block;

a second supporting block supported by the first inclining table, a second inclining table supported by the second supporting block, wherein the second inclining table inclines in a different direction from the first inclining table; and holding means for holding the specimen, the holding means being supported by the second inclining table.

26. An apparatus according to claim 25, further comprising a coil for exciting the lens, said coil being disposed around the first magnetic pole and the inner surface of the coil being substantially in contact with the first magnetic pole.

27. An objective lens for a charged particle beam apparatus in which a specimen stage is disposed, comprising:

a first magnetic pole on a bottom wall of the lens; and
a second magnetic pole on an upper wall of the lens;
said specimen stage having inclination means for supporting and inclining the specimen, wherein a relief space is formed between the specimen stage and said second magnetic pole to enable the specimen stage to move without interference with the second magnetic pole when the specimen stage is inclined.

28. A lens according to claim 27, wherein the first magnetic pole projects from the bottom wall of the lens; the second magnetic pole has a conical shape and a center axis which is in agreement with the trajectory of the charged particle beam; the inclination means having;
a first supporting block supported by the bottom wall of the lens,
a first inclining stage supported by the first supporting block,
a second supporting block supported by the first inclining table,
a second inclining table supported by the second supporting block, wherein the second inclining table inclines in a different direction from the first inclining table;
holding means for holding the specimen, the holding means being supported by the second inclining table.

29. An apparatus according to claim 28, further comprising a coil for exciting the lens, said coil being disposed around said first magnetic pole and the inner surface of the coil being substantially in contact with said first magnetic pole.

30. A specimen stage mounted inside an objective lens having a magnetic pole on a bottom wall of the lens, for use in a charged particle beam apparatus, said specimen stage comprising:
holding means for holding a specimen;
inclination means for selectively inclining said holding means;
exciting means for exciting said objective lens, said exciting means being disposed on the same side of said holding means as said magnetic pole.

31. A specimen stage according to claim 30, wherein the magnetic pole projects from the bottom wall, said inclination means being supported by the bottom wall and having a space in which said magnetic pole is inserted.

32. A specimen stage according to claim 31, wherein said inclination means comprises a first supporting block supported by the bottom wall of the lens, a first inclining table supported by said first supporting block, and said first inclining table supporting said holding means.

33. A specimen stage according to claim 31, wherein said exciting means comprises a coil.

34. A specimen stage according to claim 32, wherein said exciting means is disposed inside said supporting block.

35. A specimen stage according to claim 34, wherein said exciting means comprises a coil and the inner surface of the coil is substantially in contact with said magnetic pole.

36. A specimen stage according to claim 32, wherein said inclination means further comprises a second supporting block supported by said first inclining table, and a second inclining table supported by said second supporting block, wherein said second inclining table inclines in a different direction from the first inclining table and supports said holding means.

37. A charged particle beam apparatus, comprising:
means for generating a charged particle beam;
an objective lens for focusing the beam, said lens having a magnetic pole on its bottom wall;
a stage inside said lens for holding and inclining a specimen, including holding means for holding the specimen and inclination means for inclining the holding means;
exciting means for exciting the objective lens, said exciting means being disposed on the same side of said holding means as said magnetic pole; and
means for detecting indications characteristic of the specimen, generated from the surface of the specimen by irradiating the beam on the specimen.

38. An apparatus according to claim 37, wherein the magnetic pole projects from the bottom wall of the lens; and said inclination means includes:
a first supporting block supported by the bottom wall of the lens;
a first inclining table supported by the first supporting block;
a second supporting block supported by the first including table; and
a second inclining table supported by the second supporting block, wherein the second inclining table inclines in a different direction from the first including table and supports the holding means.

39. An objective lens for a charged particle beam apparatus in which a stage of a specimen is disposed, comprising:
a magnetic pole on a bottom wall of the lens;
a stage having holding means for holding the specimen and inclination means for inclining the holding means; and
exciting means for exciting the lens, the exciting means being disposed on the same side of the holding means as said magnetic pole.

40. A lens according to claim 39, wherein the magnetic pole projects from the bottom wall of the lens; and said inclination means includes:
a first supporting block supported by the bottom wall of the lens;
a first inclining table supported by the first supporting block;
a second supporting block supported by the first inclining table; and
a second inclining table supported by the second supporting block, wherein the second inclining table inclines in a different direction from the first inclining table and supports the holding means;
said exciting means comprises a coil, the inner surface of the coil being substantially in contact with said magnetic pole.

41. A specimen stage mounted inside an objective lens having a magnetic pole projecting from a bottom wall of the lens, for use in a charged particle beam apparatus, comprising:
holding means for holding a specimen;
inclination means for inclining the holding means, the inclination means being supported by the bottom wall and having a first space in which said magnetic pole is inserted;
horizontal shifting means for shifting said holding means in a direction parallel to the bottom wall, said horizontal shifting means being disposed between said holding means and said inclination means, being supported by the inclination means and having a second space in which the projecting magnetic pole is inserted.

42. A specimen stage according to claim 41, further comprising driving means for shifting the horizontal shifting means, said driving means for disposed inside the objective lens and being supported by the inclination means.

43. A specimen stage according to claim 42, wherein said horizontal shifting means comprises a first shifting table for shifting said holding means in a first direction and a second shifting table for shifting said holding means in a second direction.

44. A specimen stage according to claim 43, wherein the first shifting table is supported by an upper surface of the inclination means so as to movable along said upper surface;
- the second shifting table is supported by an upper surface of the first shifting table so as to be movable along said upper surface of the first shifting table;
- said driving means comprising first driving means for driving said first shifting table, said first driving means being disposed between said inclination means and said first shifting table, and second driving means for driving said second shifting table, said second driving means is being disposed between said first shifting table and said second shifting table.

45. A specimen stage according to claim 44, wherein a surface defining said first space in said inclination means has substantially equal diameter to that of a surface defining said second space in said horizontal shifting means.

46. A specimen stage according to claim 43, wherein said inclination means comprises a first supporting block supported by the bottom wall of the lens, a first inclining table supported by said first supporting block, a second supporting block supported by said first inclining table and a second inclining table supported by said second supporting block.

47. A charged particle beam apparatus, comprising:
(a) means for generating a charged particle beam;
(b) an objective lens for focusing said beam, said lens having a magnetic pole projecting from a bottom wall of the lens;
(c) a stage inside the lens for holding and inclining a specimen, said stage comprising (c-1) holding means for holding the specimen, (c-2) inclination means for inclining the holding means, said inclination means being supported by said bottom wall and having a first space in which said magnetic pole is inserted and (c-3) horizontal shifting means for shifting the holding means in a direction parallel to said bottom wall, said horizontal shifting means being disposed between said holding means and said inclination means, being supported by said inclination means and having a second space in which said magnetic pole is inserted; and
(d) means for detecting indications characteristic of the specimen, generated from the surface of the specimen by irradiating the beam on the specimen.

48. An apparatus according to claim 47, wherein said inclination means comprises a first supporting block supported by said bottom wall of the lens, a first inclining table supported by said first supporting block, a second supporting block supported by said first inclining table and a second inclining table supported by said second supporting block;
- said horizontal shifting means comprising a first shifting table for shifting said holding means in a first direction and a second shifting table for shifting in a second direction, wherein said first shifting table is supported by an upper surface of said inclination means so as to be movable along said upper surface and said second shifting table is supported by an upper surface of said first shifting table so as to be movable along said upper surface of said first shifting table;
- and further comprising:
- first driving means for driving said first shifting table, said first driving means being disposed between said inclination means and said shifting table, and second driving means for driving said second shifting table, said second driving means being disposed between said first shifting table and the second shifting table, so that the first and second driving means are substantially disposed inside the objective lens.

49. An objective lens for a charged particle beam apparatus in which a stage of a specimen is disposed, comprising:
(a) a magnetic pole projecting from a bottom wall of the lens;
(b) a stage having (b-1) holding means for holding the specimen, (b-2) inclination means for inclining the holding means, said inclination means being supported by said bottom wall and having a first space in which said magnetic pole is inserted and (b-3) horizontal shifting means for shifting the holding means in a direction parallel to said bottom wall, said horizontal shifting means being disposed between said holding means and said inclination means, being supported by the inclination means and having a second space in which said magnetic pole is inserted.

50. A lens according to claim 49, wherein said means comprises a first supporting block supported by the bottom wall of the lens, a first inclining table supported by said first supporting bloc, a second supporting block supported by said first inclining table and a second inclining table supported by said second supporting block;
- said horizontal shifting means comprising a first shifting table for shifting said holding means in a first direction and a second shifting table for shifting said holding means in a second direction, wherein said first shifting table is supported by an upper surface of said inclination means so as to be movable along said upper surface and the second shifting table is supported by an upper surface of said first shifting table so as to be movable along said upper surface of said first shifting table;
- and further comprising:
- first driving means for driving said first shifting table, said first driving means being disposed between said inclination means and said first shifting table, and second driving means for being disposed between said first shifting table and said second shifting table, so that said first and second driving means are substantially disposed inside the objective lens.

51. A specimen stage mounted inside an objective lens for use in a charged particle beam apparatus, comprising:
- holding means for holding a specimen;
- horizontal shifting means for shifting the holding means in a direction parallel to a bottom wall of said lens, said horizontal shifting means being supported by said bottom wall of the lens; and
- driving means for driving said horizontal shifting means and for stopping it at a predetermined position, said driving means being disposed inside the objective lens.

52. A specimen stage according to claim 51, further comprising inclination means for inclining the holding means, wherein said horizontal shifting means is supported by said bottom wall through said inclination means.

53. A specimen stage according to claim 51, wherein said horizontal shifting means comprise a first shifting table for shifting said holding means in a first direction and a second shifting table for shifting said holding means in a second direction.

54. A specimen stage according to claim 53, wherein:
said first shifting table is supported by said bottom wall of the lens so as to be movable along the wall; and
said second shifting table is supported by an upper surface of said first shifting table so as to be movable along said upper surface of said first shifting table.

55. A specimen stage according to claim 54, wherein said driving means comprises first driving means for driving said first shifting table, said first driving means being disposed between an inclination means and said first shifting table, and second driving means for driving said second shifting table, said second driving means being disposed between said first shifting table and said second shifting table.

56. A specimen stage according to claim 51, wherein said objective lens has a magnetic pole projecting from the bottom wall of the lens, and said horizontal shifting means has a space in which said magnetic pole is inserted.

57. A charged particle beam apparatus, comprising:
(a) means for generating a charged particle beam;
(b) an objective lens for focusing the beam, said lens having a magnetic pole projecting from a bottom wall of the lens;
(c) a stage inside the lens for shifting a specimen horizontally, said stage comprising (c-1) holding means for holding the specimen, (c-2) horizontal shifting means for shifting the holding means horizontal in a direction parallel to said bottom wall, said horizontal shifting means being supported by said bottom wall of the lens, and (c-3) driving means for driving said horizontal shifting means and stopping it at a predetermined position, said driving means being disposed inside the objective lens; and
(d) means for detecting indications characteristic of the specimen, generated from the surface of the specimen by irradiating the beam on the specimen.

58. An apparatus according to claim 57, wherein said horizontal shifting means comprises a first shifting table for shifting said holding means in a first direction and a second shifting table for shifting said holding means in a second direction, wherein said first shifting table is supported by said bottom wall of the lens so as to be movable along said wall and said second shifting table is supported by an upper surface of said first shifting table so as to be movable along said upper surface;
said driving means comprising first driving means for driving the first shifting table, said first driving means being disposed between the bottom wall and the first shifting table, and second driving means for driving the second shifting table, said second driving means being disposed between the first shifting table and the second shifting table, so that said first and second driving means are substantially disposed inside the objective lens.

59. An objective lens for a charged particle beam apparatus in which a stage of a specimen is disposed, comprising:
holding means for holding a specimen;
horizontal shifting means for shifting the holding means in a direction parallel to said wall, said horizontal shifting means being supported by said bottom wall of the lens; and
driving means for driving said horizontal shifting means and stopping it at a predetermined position, said driving means being disposed inside the objective lens.

60. A lens according to claim 59, wherein said horizontal shifting means comprises a first shifting table for shifting said holding means in a first direction and a second shifting table for shifting said holding means in a second direction, wherein the first shifting table is supported by said bottom wall so as to be movable along said wall and the second shifting table is supported by an upper surface of the first shifting table so as to be movable along said upper surface;
said driving means comprising first driving means for driving the first shifting table, said first driving means being disposed between said bottom wall and said first shifting table, and second driving means for driving said second shifting table, said second driving means being disposed between said first shifting table and said second shifting table, so that said first and second driving means are substantially disposed inside the objective lens.

* * * * *